United States Patent
Chen

(10) Patent No.: US 10,903,840 B2
(45) Date of Patent: Jan. 26, 2021

(54) PAD TRACKING CIRCUIT FOR HIGH-VOLTAGE INPUT-TOLERANT OUTPUT BUFFER

(71) Applicant: MEDIATEK INC., Hsin-Chu (TW)

(72) Inventor: Yu-Jen Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/285,213

(22) Filed: Feb. 26, 2019

(65) Prior Publication Data

US 2019/0305778 A1 Oct. 3, 2019

Related U.S. Application Data

(60) Provisional application No. 62/651,328, filed on Apr. 2, 2018.

(51) Int. Cl.
*H03K 19/0185* (2006.01)
*H03K 17/687* (2006.01)
*H03K 19/003* (2006.01)

(52) U.S. Cl.
CPC . *H03K 19/018521* (2013.01); *H03K 17/6872* (2013.01); *H03K 19/00315* (2013.01)

(58) Field of Classification Search
CPC ..... H03K 19/018521; H03K 19/00315; H03K 19/0005; H03K 19/00384; H03K 17/102; H03K 17/162; H03K 17/18; H03K 5/135
USPC .......................... 327/108, 109, 110, 111, 112
See application file for complete search history.

(56) References Cited

U.S. PATENT DOCUMENTS

| | | | |
|---|---|---|---|
| 6,859,074 B2 | 2/2005 | Ajit | |
| 9,525,421 B2* | 12/2016 | Potluri | ............. H03K 19/17744 |
| 2003/0071662 A1* | 4/2003 | Kwong | ............... H01L 27/0285 |
| | | | 327/112 |
| 2003/0122606 A1 | 7/2003 | Ajit | |
| 2008/0061832 A1* | 3/2008 | Hu | ................... H03K 19/00361 |
| | | | 326/83 |
| 2009/0002028 A1 | 1/2009 | Ker | |
| 2010/0141324 A1 | 6/2010 | Wang | |
| 2010/0176848 A1* | 7/2010 | Du | ........................ G11C 7/1057 |
| | | | 327/108 |
| 2013/0141061 A1* | 6/2013 | Chen | ....................... H02M 1/32 |
| | | | 323/271 |
| 2017/0264290 A1 | 9/2017 | Fukuda | |

* cited by examiner

*Primary Examiner* — John W Poos
(74) *Attorney, Agent, or Firm* — Winston Hsu

(57) ABSTRACT

The present invention provides a circuit including an output buffer, a tracking circuit and a pre-driver, where the output buffer includes at least one P-type transistor and at least one N-type transistor, the at least one P-type transistor is coupled between a supply voltage and a pad, and the at least one N-type transistor is coupled between a ground voltage and the pad. In the operations of the circuit, the tracking circuit is configured to generate a tracking signal control signal according to a voltage level at the pad, and the pre-driver is configured to generate a control signal to control the at least one P-type transistor or the at least one N-type transistor according to the tracking signal.

13 Claims, 10 Drawing Sheets

Input mode

- 100
- VDD
- 2xVDD
- 130
- 2xVDD — MP1
- 110
- Vc1 — MP2
- 120
- PTRK — Tracking circuit
- IO_PAD
- Vin
- Pre-driver
- Vc2 — MN1
- IO_Nx
- VDD — MN2
- 0V — MN3
- GND
- 140
- VDD
- VDD
- 142
- Vin'
- MN4

FIG. 1

PAD TRACKING CIRCUIT FOR HIGH-VOLTAGE INPUT-TOLERANT OUTPUT BUFFER

CROSS REFERENCE TO RELATED APPLICATIONS

This application claims the priority of U.S. Provisional Application No. 62/651,328, filed on Apr. 2, 2018, which is included herein by reference in its entirety.

BACKGROUND

In conventional general purpose input/output (GPIO) designs, an output buffer and an input buffer are connected to the same pad, and one or more transistors are added into the output buffer and the input buffer to prevent the transistors within the buffers from being damaged when the input signal has a large swing. However, in the advanced semiconductor process, the voltage endurance of the transistors become weak, so the conventional GPIO designs may suffer the stability and reliability issues. For example, assuming that the voltage endurance is of the transistors is 1.8V and the supply voltage of the output buffer is 3.3V, if the input signal has the peak 5V, the supply voltage must be charged by the high voltage (5V) from the pad, and the low-side transistors may be damaged due to high gate-drain voltages.

SUMMARY

It is therefore an objective of the present invention to provide a GPIO design, which uses a pad-tracking mechanism to control the output buffer, to solve the above-mentioned problems.

According to one embodiment of the present invention, a circuit including an output buffer, a tracking circuit and a pre-driver is provided, where the output buffer includes at least one P-type transistor and at least one N-type transistor, the at least one P-type transistor is coupled between a supply voltage and a pad, and the at least one N-type transistor is coupled between a ground voltage and the pad. In the operations of the circuit, the tracking circuit is configured to generate a tracking signal control signal according to a voltage level at the pad, and the pre-driver is configured to generate a control signal to control the at least one P-type transistor or the at least one N-type transistor according to the tracking signal.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 shows a circuit operating in the input mode according to one embodiment of the present invention.

DETAILED DESCRIPTION

Figure 2:
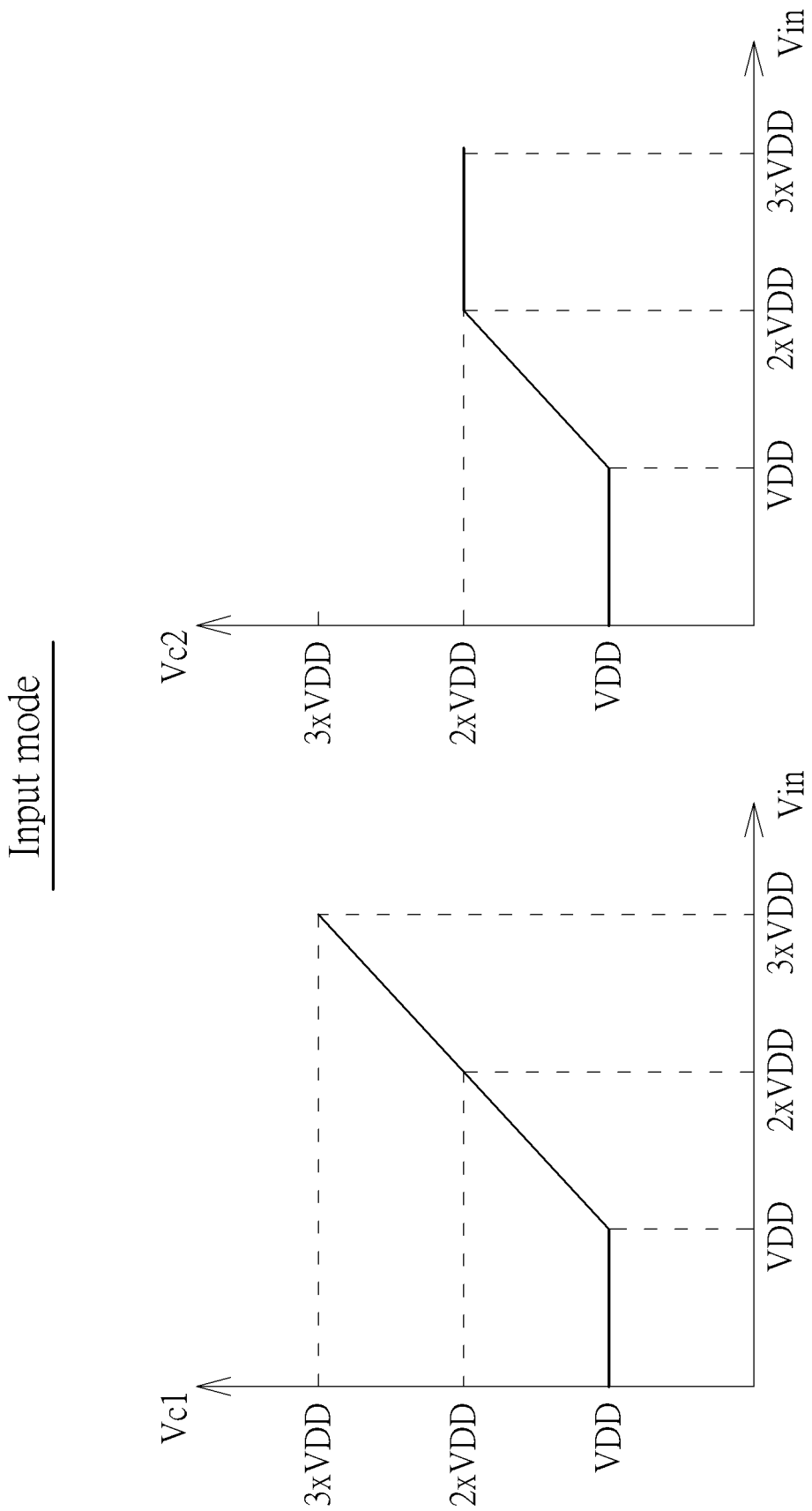
FIG. 2 shows the control signals when the circuit operates in the input mode according to one embodiment of the present invention.

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

FIG. 1 shows a circuit 100 according to one embodiment of the present invention. As shown in FIG. 1, the circuit 100 comprises an output buffer 110, a tracking circuit 120, a pre-driver 130 and an input buffer 140. The output buffer 110 comprises two P-type transistors MP1 and MP2 connected in series and three N-type transistors MN1-MN3 connected in series, where a source electrode of the P-type transistor MP1 is coupled to a supply voltage 2×VDD, a source electrode of the P-type transistor MP2 is coupled to a drain electrode of the P-type transistor MP1, and a drain electrode of the P-type transistor MP2 is coupled a pad IO_PAD; and a drain electrode of the N-type transistor MN1 is coupled to the pad IO_PAD, a drain electrode of the N-type transistor MN2 is coupled to a source electrode of the N-type transistor MN1, a drain electrode of the N-type transistor MN3 is coupled to a source electrode of the N-type transistor MN2, and a source electrode of the N-type transistor MN3 is coupled to a ground voltage. The tracking circuit 120 is coupled between the pad IO_PAD and the pre-driver 130. The pre-driver 130 serves as a mode selector and a voltage regulator supplied by two supply voltages VDD and 2×VDD. The input buffer 140 comprises an N-type transistor MN4 and a buffer 142 supplied by the supply voltage VDD.

The circuit 100 serves as an interface circuit capable of operating in an input mode or an output mode. When the circuit 100 operates in the input mode, the pre-driver 130 disables the output buffer 110, and the input buffer 140 is enabled to receive an input signal Vin from the pad IO_PAD and the N-type transistor MN1 (i.e. the input buffer 140 receives a signal IO_Nx shown in FIG. 1) to generate the buffered input signal Vin' to the following circuits. When the circuit 100 operates in the output mode, the pre-driver 130 controls the output buffer 110 to generate an output signal to the pad IO_PAD, and the input buffer 140 is disabled. FIG. 1 shows the input mode of the circuit 100.

In the circuit 100 shown in FIG. 1, the devices are manufactured by advanced semiconductor processes and the devices such as the N-type transistors MN1-MN3 and other devices have thinner gate electrodes with lower voltage endurance, and the output buffer 110 is supplied by the supply voltage 2×VDD to generate the output signal with larger swing (i.e. 2×VDD). In this embodiment, if the circuit 100 operates in the input mode and the pad IO_PAD receives the input signal Vin whose swing is larger than 2×VDD (e.g. 3×VDD), in order to avoid a current flowing from the pad IO_PAD to the supply voltage 2×VDD to charge the supply voltage 2×VDD, the tracking circuit 120 is configured to generate a tracking signal PTRK according to the voltage level at the pad IO_PAD, and the pre-driver 130 generates a control signal Vc1 according to the tracking signal PTRK to fully turn off P-type transistor MP2. In addition, in order to prevent the N-type transistors from being damaged by the input signal Vin with large swing, the pre-driver 130 further generates a control signal Vc2 according to the tracking signal PTRK to control the N-type transistor MN1, and the N-type transistors MN1-MN3 operate as a voltage divider to lower a gate-drain voltage of each of the N-type transistors MN1-MN3.

It is noted that the terms "VDD", "2×VDD" and "3×VDD" are used to describe the embodiments of the present invention, and it is not meant that 2×VDD is exactly double of VDD, and it is not meant that 3×VDD is triple of VDD. In practice, 2×VDD may be any suitable voltage greater than VDD, and 3×VDD may be any suitable voltage greater than 2×VDD, for example, VDD may be 1.8V, 2×VDD may be 3.3V, and 3×VDD may be 5V.

Specifically, FIG. 2 shows the control signals Vc1 and Vc2 when the circuit 100 operates in the input mode according to one embodiment of the present invention. As shown in FIG. 1 and FIG. 2, when the circuit 100 operates in the input mode, the pre-driver 130 generates 2×VDD to a gate electrode of the P-type transistor MP1, and the control signal Vc1 applied to a gate electrode of the P-type transistor MP2 is proportional to the voltage level of the input signal Vin (in this embodiment, the control signal Vc1 is equal to the input signal Vin) if the input signal Vin is greater than VDD. By using the control signal Vc1 whose voltage level is equal to the input signal Vin when the input signal Vin is greater than 2×VDD, the P-type transistor MP2 can be fully turned off to avoid the leakage current, so the supply voltage 2×VDD may not be influenced by the input signal Vin with higher swing (e.g. 3×VDD). In addition, by using the control signal Vc2 to the N-type transistor MN1, applying VDD to a gate electrode of the N-type transistor MN2 applying zero voltage to a gate electrode of the N-type transistor MN3, the N-type transistors MN1-MN3 can serve as the voltage divider to make the gate-drain voltages be lower than the voltage endurance.

In one embodiment, the P-type transistor MP2 may be controlled to have a floating well when the circuit 100 operates in the input mode, to turn off the P-type transistor MP2 more completely.

Figure 3:
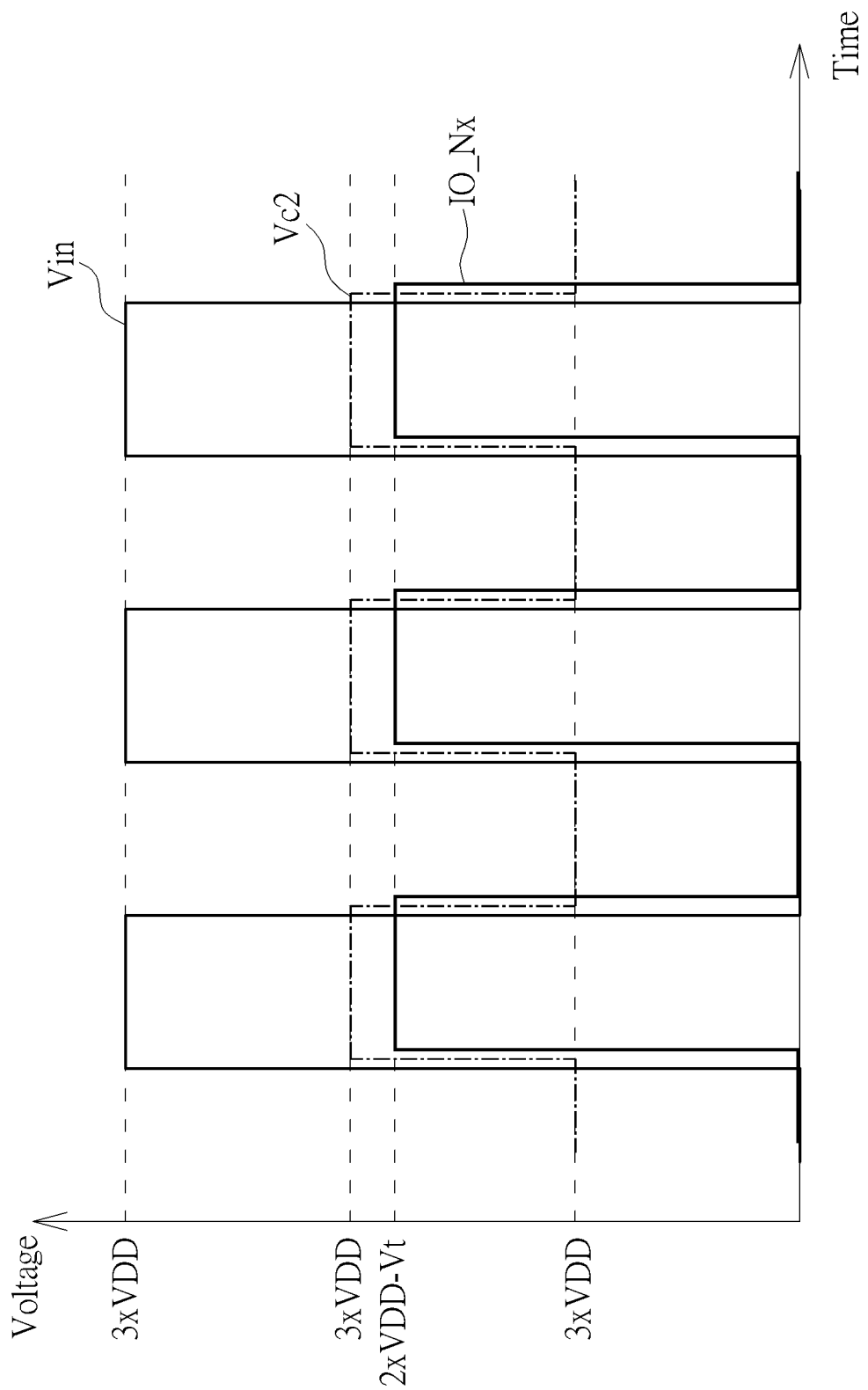
FIG. 3 shows waveforms of some signals shown in FIG. 1.

Regarding the input buffer 140, referring to the waveforms shown in FIG. 3, by applying the control signal Vc2 to the N-type transistor MN1 and the input buffer 140 receives the signal IO_Nx at the source electrode of the N-type transistor MN1, the swing of the signal IO_Nx is limited to be (2×VDD−Vt), where "Vt" is a threshold voltage of the N-type transistor MN1. Therefore, even if the input signal Vin has a large swing such as 3×VDD, the signal IO_Nx received by the input buffer 140 has the swing ranging from 0V to (2×VDD−Vt), and the designs of the input buffer 140 becomes easier to save the manufacturing and design costs.

Figure 4:
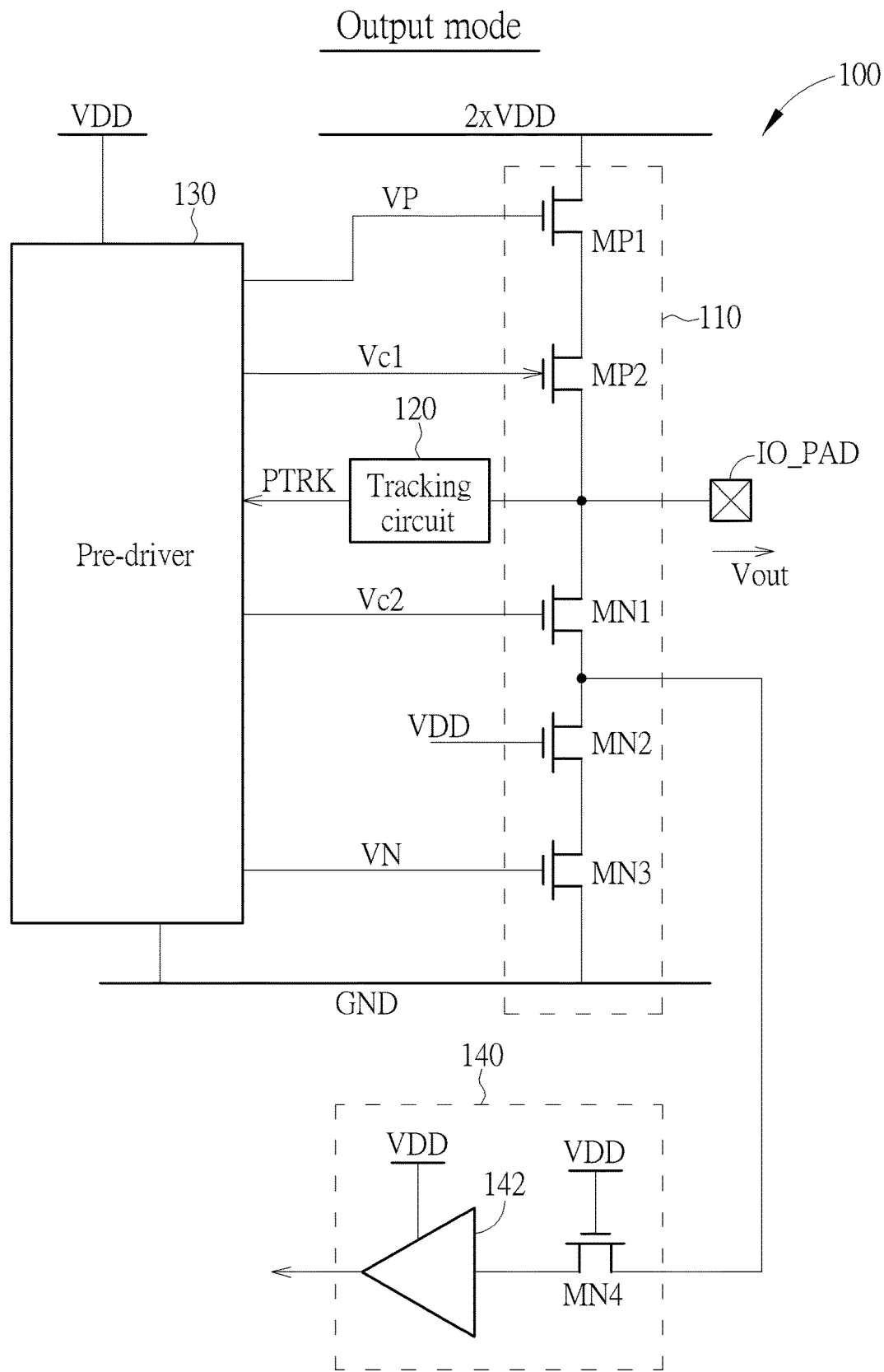
FIG. 4 shows a circuit operating in the output mode according to one embodiment of the present invention.
Figure 5:
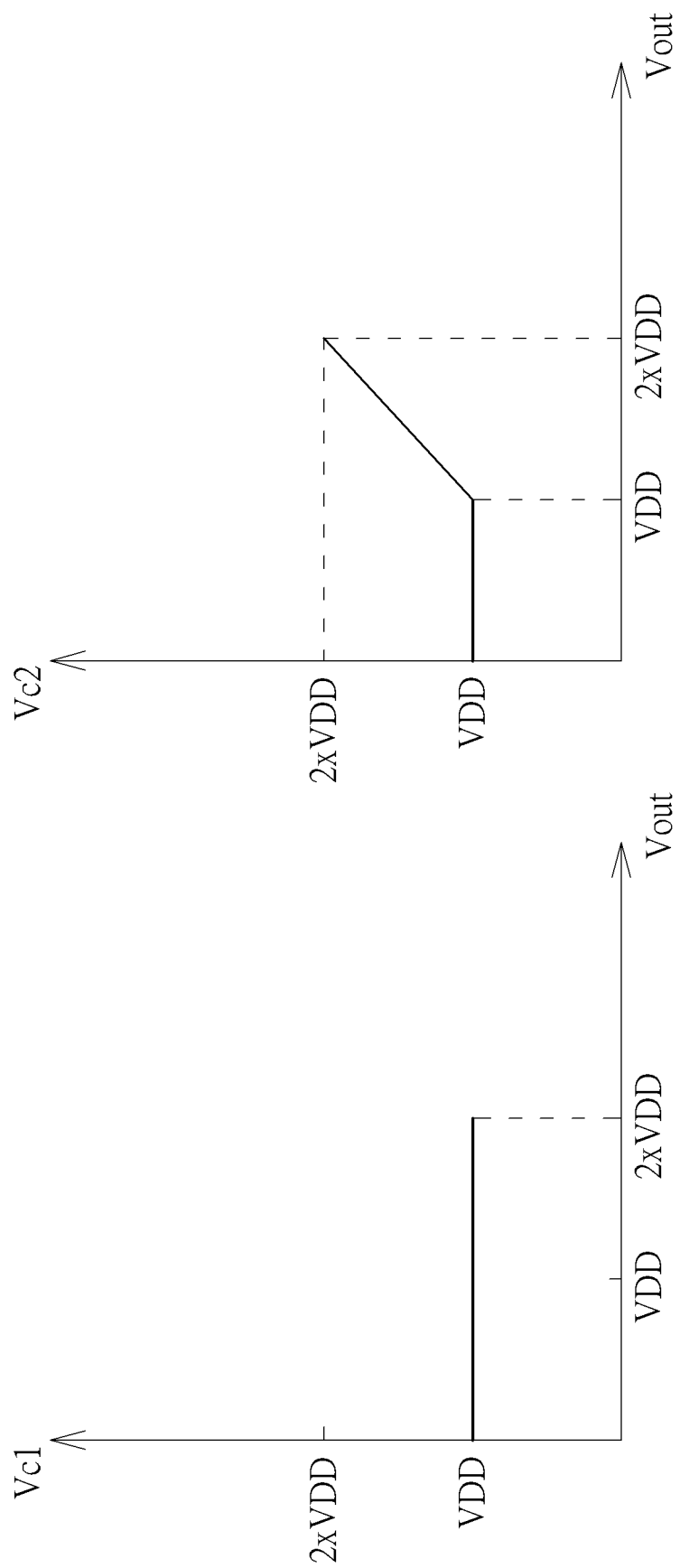
FIG. 5 shows the control signals when the circuit operates in the output mode according to one embodiment of the present invention.

FIG. 4 shows the output mode of the circuit 100 according to one embodiment of the present invention, and FIG. 5 shows the control signals Vc1 and Vc2 when the circuit 100 operates in the output mode according to one embodiment of the present invention. In the embodiments shown in FIG. 4 and FIG. 5, the pre-driver 130 generates the control signal Vc1 whose voltage level is equal to VDD to always turn on the P-type transistor MP2, the N-type transistor MN1 is always turned on by applying the control signal Vc2 whose voltage level is equal to or greater than VDD, and the N-type transistor MN2 is also always turned on by applying VDD to the gate electrode. When the circuit 100 wants to a logic "0" (i.e. low voltage level), the pre-driver 130 generates a control signal VP with any suitable level to turn off the P-type transistor MP1, and generates a control signal VN with any suitable level to turn on the N-type transistor MN3; and when the circuit 100 wants to a logic "1" (i.e. high voltage level such as 2×VDD in this embodiment), the pre-driver 130 generates the control signal VP with any suitable level to turn on the P-type transistor MP1, and generates the control signal VN equal to 0V to turn off the N-type transistor MN3, to generate the output signal Vout such as a clock output signal.

Figure 6:
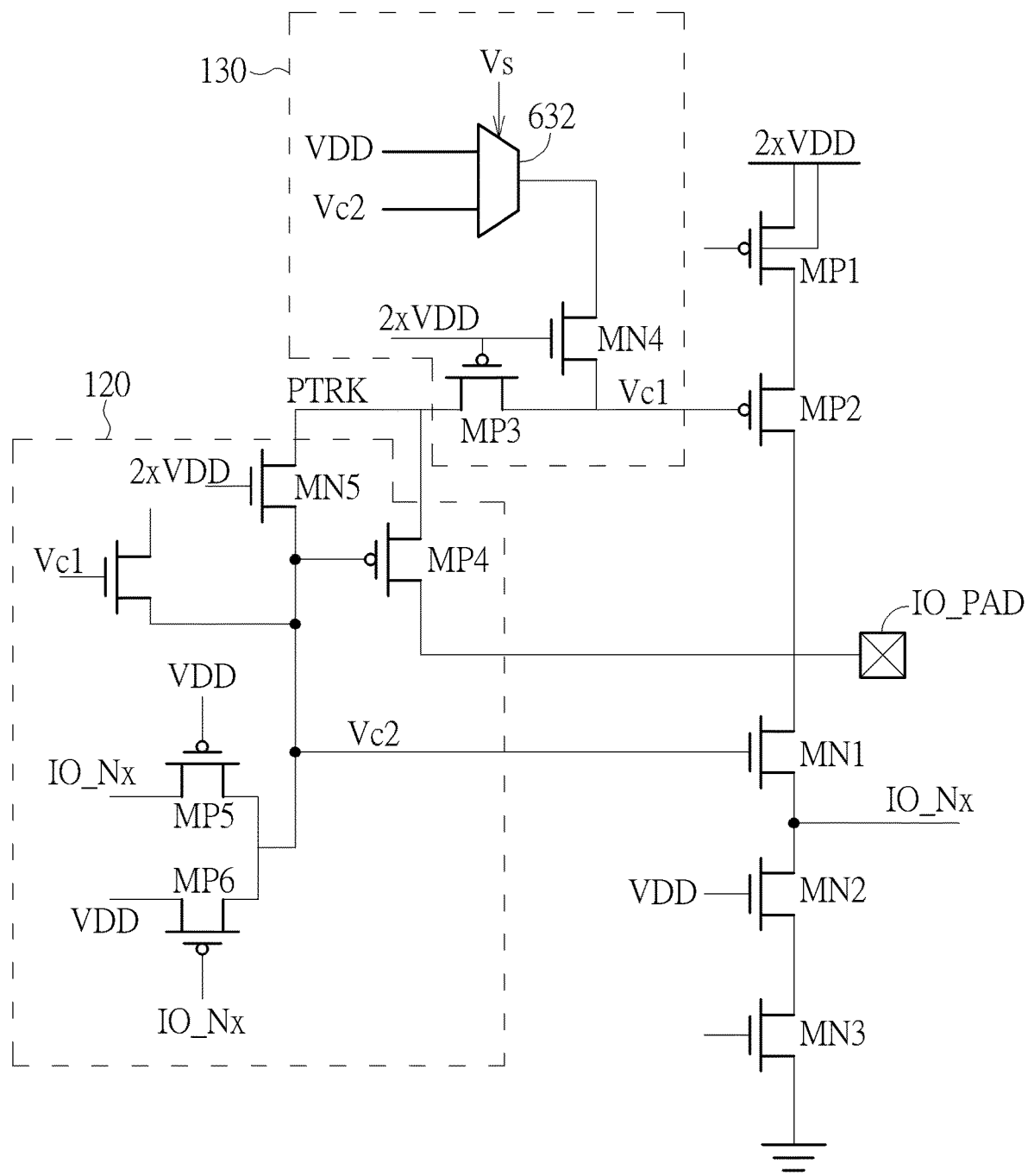
FIG. 6 is a diagram illustrating the tracking circuit and at least a portion of the pre-driver shown in FIG. 1 according to one embodiment of the present invention.

FIG. 6 is a diagram illustrating the tracking circuit 120 and at least a portion of the pre-driver 130 according to one embodiment of the present invention. As shown in FIG. 6, the pre-driver 130 comprises at least a mode selector and a voltage regulator, where the mode selector comprises a multiplexer 632 for referring to a mode selection signal Vs to output VDD if the circuit 100 operates in the output mode, and output the control signal Vc2 if the circuit 100 operates in the input mode; and the voltage regulator comprises an N-type transistor MN4 and a P-type transistor MP3 whose gate electrodes are connected to 2×VDD. The tracking circuit 120 comprises P-type transistors MP4-MP6 and N-type transistors MN5 and MN6. It is noted that the embodiments shown in FIG. 6 are for illustratively purposes only, and it is not a limitation of the present invention. As long as the control signals Vc1 and Vc2 are generated according to the tracking signal PTRK or a voltage at the pad IO_PAD, the tracking circuit 120 and the pre-driver 130 may have other circuit designs, or the tracking circuit 120 and the pre-driver 130 may be integrated together.

Figure 7:
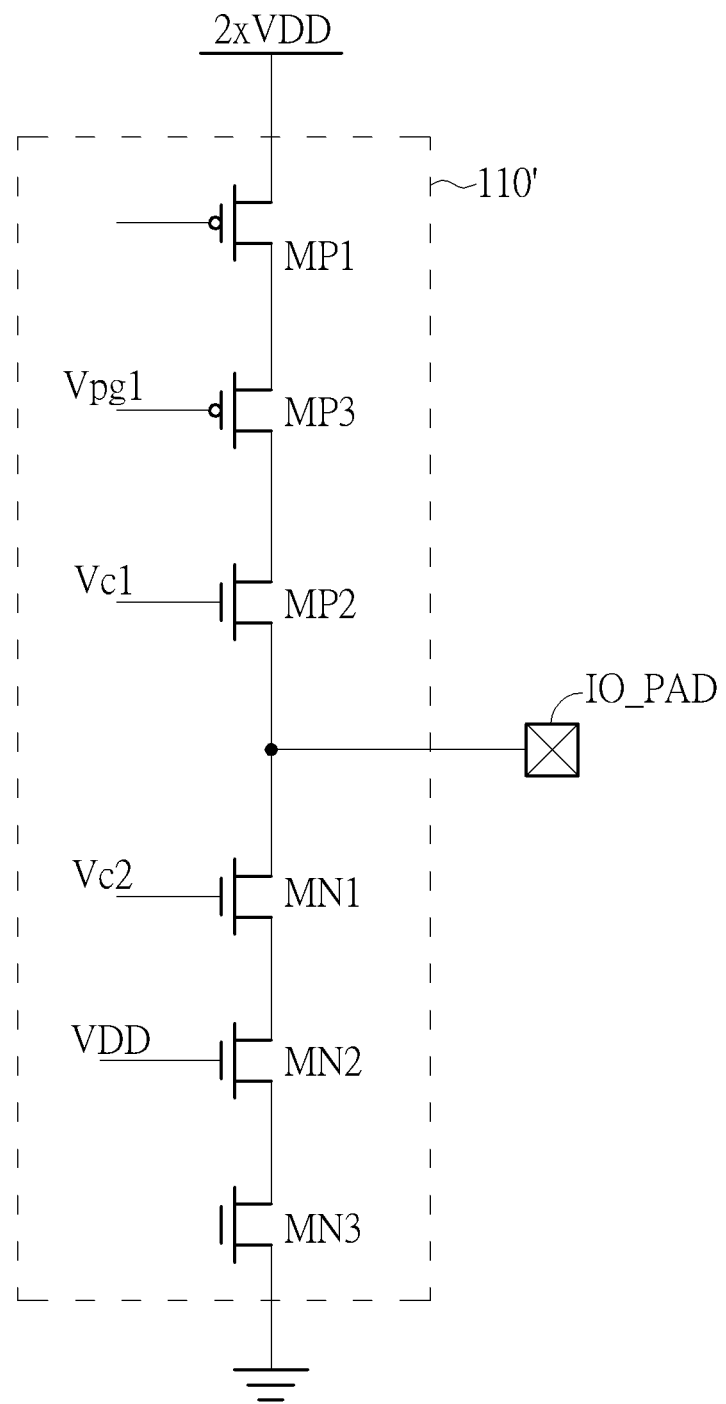
FIG. 7 is an output buffer according to another embodiment of the present invention.

In addition, for the better reliability purpose, the output buffer 110 may be modified to comprise more than two P-type transistors. Refer to FIG. 7, the modified output buffer 110' shown in FIG. 1 may further comprise a P-type transistor MP3 coupled between the P-type transistors MP1 and MP2, and a gate electrode of the P-type transistor MP3 may be biased by a voltage Vpq1. In one embodiment, the voltage Vpq1 may be an output signal of the multiplexer 632 shown in FIG. 6.

Figure 8:
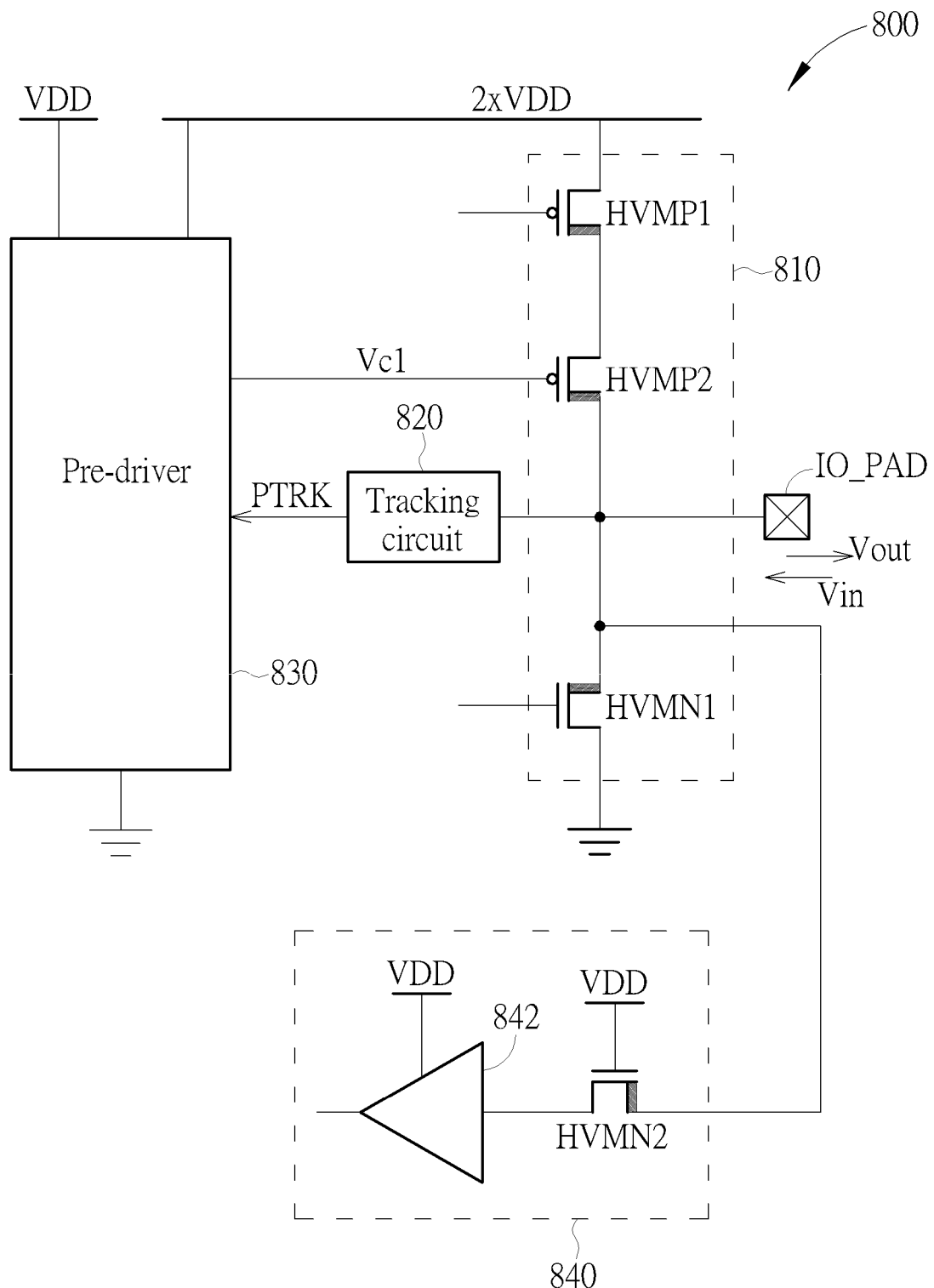
FIG. 8 shows a circuit according to another embodiment of the present invention.

FIG. 8 shows a circuit 800 according to another embodiment of the present invention. As shown in FIG. 8, the circuit 800 comprises an output buffer 810, a tracking circuit 820, a pre-driver 830 and an input buffer 840. The output buffer 810 comprises two high-voltage P-type transistors HVMP1 and HVMP2 connected in series and one high-voltage N-type transistor HVMN1, where a source electrode of the high-voltage P-type transistor HVMP1 is coupled to a supply voltage 2×VDD, a source electrode of the high-voltage P-type transistor HVMP2 is coupled to a drain electrode of the high-voltage P-type transistor HVMP1, and a drain electrode of the high-voltage P-type transistor HVMP2 is coupled a pad IO_PAD; and a drain electrode of the high-voltage N-type transistor HVMN1 is coupled to the pad IO_PAD, and a source electrode of the high-voltage N-type transistor HVMN1 is coupled to a ground voltage. The tracking circuit 820 is coupled between the pad IO_PAD and the pre-driver 830. The pre-driver 830 serves as a mode selector and a voltage regulator supplied by two supply voltages VDD and 2×VDD. The input buffer 840 comprises a high-voltage N-type transistor HVMN2 and a buffer 842 supplied by the supply voltage VDD.

In one embodiment, each of the high-voltage P-type transistors HVMP1, HVMP2, and the high-voltage N-type transistors HVMN1, HVMN2 can be implemented by high voltage devices such as laterally diffused metal oxide semiconductor (LDMOS).

The circuit 800 serves as an interface circuit capable of operating in an input mode or an output mode. When the circuit 800 operates in the input mode, the pre-driver 830 disables the output buffer 810, and the input buffer 840 is enabled to receive an input signal Vin from the pad IO_PAD. When the circuit 800 operates in the output mode, the pre-driver 830 controls the output buffer 810 to generate an output signal Vout to the pad IO_PAD, and the input buffer 840 is disabled.

Figure 9:
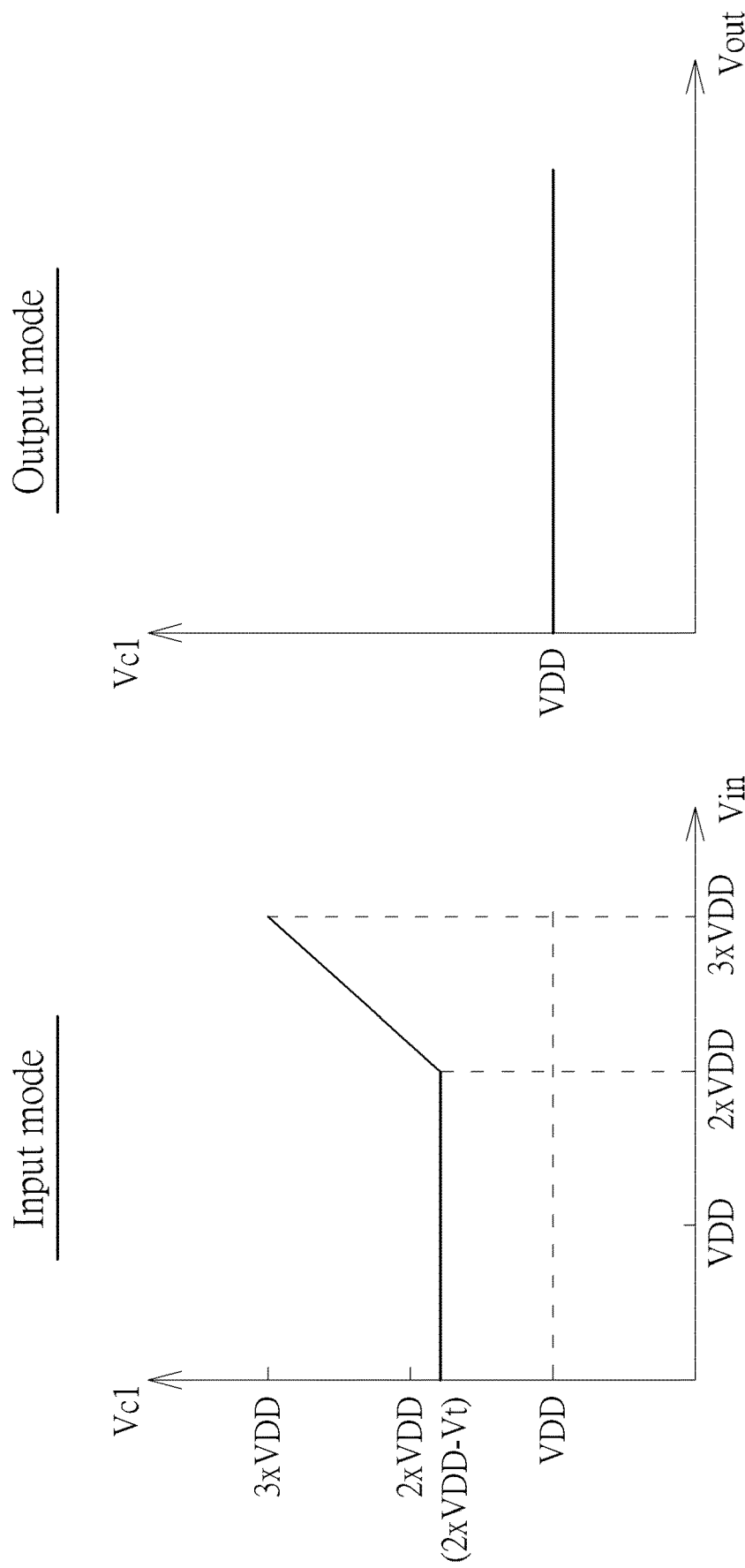
FIG. 9 shows the control signal when the circuit operates in the input mode and output mode according to one embodiment of the present invention.

If the circuit 800 operates in the input mode and the pad IO_PAD receives the input signal Vin whose swing is larger than 2×VDD (e.g. 3×VDD), in order to avoid a current flowing from the pad IO_PAD to the supply voltage 2×VDD to charge the supply voltage 2×VDD, the tracking circuit 820 is configured to generate a tracking signal PTRK according to the voltage level at the pad IO_PAD, and the pre-driver 830 generates a control signal Vc1 according to the tracking signal PTRK to fully turn off high-voltage P-type transistor HVMP2. Specifically, FIG. 9 shows the control signal Vc1 when the circuit 800 operates in the input mode according to one embodiment of the present invention. As shown in FIG. 8 and FIG. 9, when the circuit 800 operates in the input mode, the pre-driver 830 generates 2×VDD to a gate electrode of the high-voltage P-type transistor HVMP1, and the control signal Vc1 applied to a gate electrode of the high-voltage P-type transistor HVMP2 is proportional to the voltage level of the input signal Vin if the input signal Vin is greater than 2×VDD. By using the control signal Vc1 whose voltage level is proportional to the input signal Vin when the input signal Vin is greater than 2×VDD, the high-voltage P-type transistor HVMP2 can be fully turned off to avoid the leakage current, so the supply voltage 2×VDD may not be influenced by the input signal Vin with higher swing (e.g. 3×VDD).

FIG. 9 also shows the control signal Vc1 when the circuit 800 operates in the output mode according to one embodiment of the present invention. In the embodiments shown in FIG. 8 and FIG. 9, the pre-driver 830 generates the control signal Vc1 whose voltage level is equal to VDD to always turn on the high-voltage P-type transistor HVMP2. When the circuit 800 wants to a logic "0" (i.e. low voltage level), the pre-driver 830 generates a control signal with any suitable level to turn off the high-voltage P-type transistor HVMP1, and generates a control signal with any suitable level to turn on the high-voltage N-type transistor HVMN1; and when the circuit 800 wants to a logic "1" (i.e. high voltage level such as 2×VDD in this embodiment), the pre-driver 830 generates the control signal with any suitable level to turn on the high-voltage P-type transistor HVMP1, and generates the control signal with any suitable level to turn off the high-voltage N-type transistor HVMN1, to generate the output signal Vout.

Figure 10:
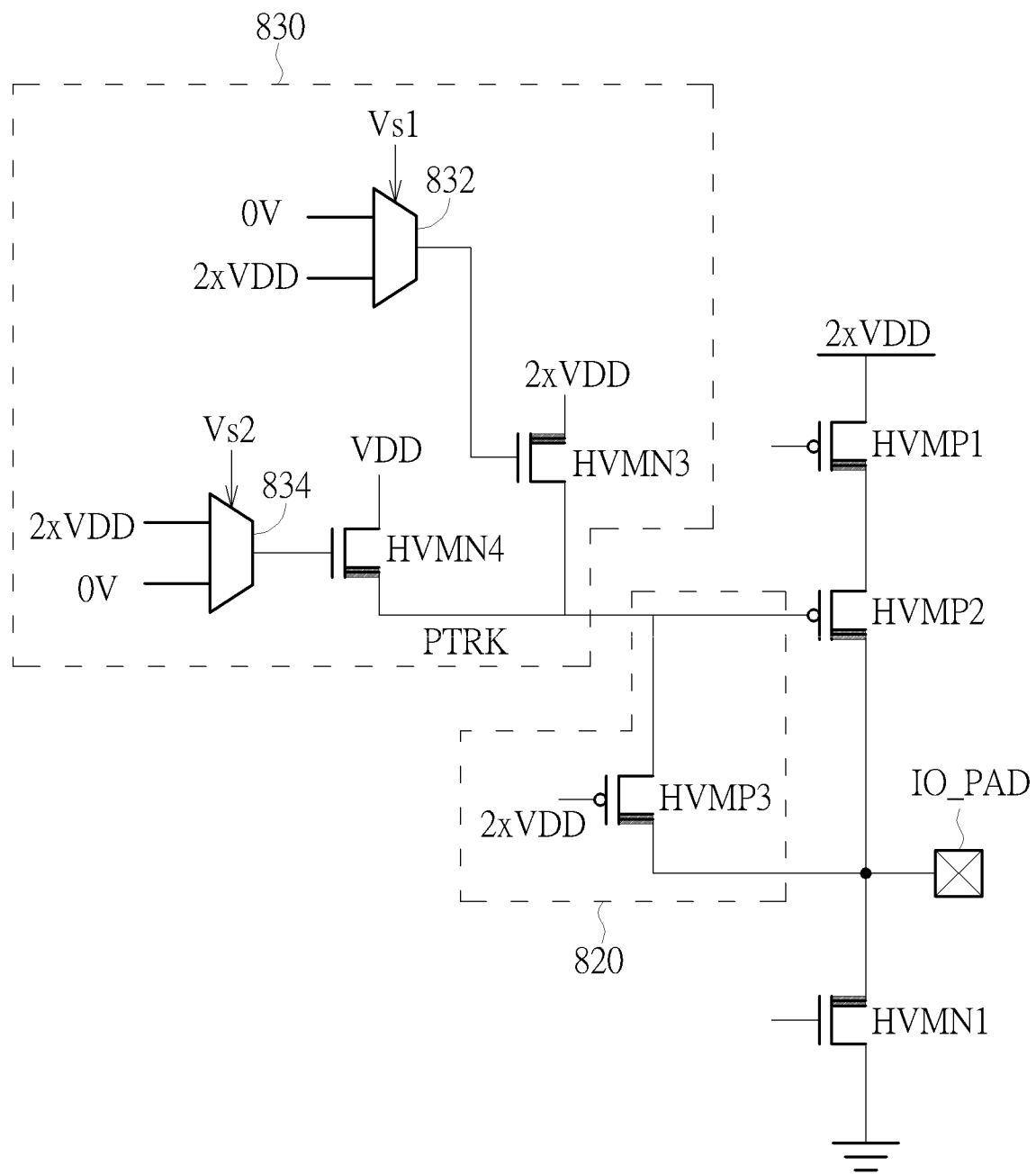
FIG. 10 is a diagram illustrating the tracking circuit and at least a portion of the pre-driver shown in FIG. 8 according to another embodiment of the present invention.

FIG. 10 is a diagram illustrating the tracking circuit 820 and at least a portion of the pre-driver 830 according to one embodiment of the present invention. As shown in FIG. 8, the pre-driver 830 comprises high-voltage N-type transistors HVMN3 and HVMN4 and two multiplexers 832 and 834, where the multiplexer 832 is configured to refer to a mode selection signal Vs1 to output 0V if the circuit 800 operates in the output mode, and output 2×VDD if the circuit 800 operates in the input mode; and the multiplexer 834 is configured to refer to a mode selection signal Vs2 to output 2×VDD if the circuit 800 operates in the output mode, and output 0V if the circuit 800 operates in the input mode. The tracking circuit 820 is implemented by a high-voltage P-type transistor HVMP3. In the embodiment shown in FIG. 10, the tracking signal PTRK serves as the control signal Vc1. It is noted that the embodiments shown in FIG. 10 are for illustratively purposes only, and it is not a limitation of the present invention. As long as the control signal Vc1 are generated according to the tracking signal PTRK or a voltage at the pad IO_PAD, the tracking circuit 820 and the pre-driver 830 may have other circuit designs, or the tracking circuit 820 and the pre-driver 830 may be integrated together.

In another embodiment, the output buffer 810 shown in FIG. 8 may be modified by adding another N-type transistor between the pad IO_PAD and the high-voltage N-type transistor HVMN1.

Briefly summarized, in the circuit of the present invention, by using the pad-tracking mechanism to control the output buffer in the input mode of the circuit, the P-type transistors can be fully turned off to prevent the supply voltage from being charged by the input signal with large swing, and the N-type transistors within the output buffer operates as the voltage divider to lower the gate-drain voltage. Therefore, the circuit of the present invention can be manufactured by the advanced semiconductor processes, and has high-voltage input-tolerance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit, comprising:
    an output buffer comprising at least one P-type transistor and at least one N-type transistor, wherein the at least one P-type transistor is coupled between a supply voltage and a pad, and the at least one N-type transistor is coupled between a ground voltage and the pad;
    a tracking circuit, coupled to the pad, for receiving a signal from the pad, and referring to a voltage level of the signal from the pad to generate a tracking signal; and
    a pre-driver, coupled to the tracking circuit, for generating a control signal to control the at least one P-type transistor or the at least one N-type transistor according to the tracking signal;
    wherein the circuit selectively operates in an input mode or an output mode, when the circuit operates in the input mode, the circuit receives an input signal from the pad, the output buffer is disabled, and the pre-driver refers to the tracking signal to generate the control signal to control the at least one P-type transistor or the at least one N-type transistor;
    wherein the output buffer comprises a plurality of P-type transistors connected in series, and the pre-driver refers to the tracking signal to generate the control signal to control a gate electrode of one of the plurality of P-type transistors; and if a voltage level of the input signal is greater than the supply voltage of the output buffer, the control signal applied to the one of the plurality of P-type transistors is proportional to the input signal.

2. The circuit of claim 1, wherein the plurality of P-type transistors comprises:
a first P-type transistor, wherein a source electrode of the first P-type transistor is coupled to the supply voltage; and
a second P-type transistor, wherein a source electrode of the second P-type transistor is coupled to a drain electrode of the first P-type transistor, and a drain electrode of the second P-type transistor is coupled to the pad;
wherein if a voltage level of the input signal is greater than the supply voltage of the output buffer, the pre-driver generates the control signal whose voltage level is proportional to the voltage level input signal to a gate electrode of the second P-type transistor to fully turn off the second P-type transistor.

3. The circuit of claim 2, wherein the first P-type transistor and the first N-type transistors are high voltage devices.

4. The circuit of claim 1, wherein the plurality of P-type transistors comprises:
a first P-type transistor, wherein a source electrode of the first P-type transistor is coupled to the supply voltage;
a second P-type transistor, wherein a source electrode of the second P-type transistor is coupled to a drain electrode of the first P-type transistor; and
a third P-type transistor, wherein a source electrode of the third P-type transistor is coupled to a drain electrode of the second P-type transistor, and a drain electrode of the third P-type transistor is coupled to the pad;
wherein if a voltage level of the input signal is greater than the supply voltage of the output buffer, the pre-driver generates the control signal whose voltage level is proportional to the voltage level of the input signal to a gate electrode of the third P-type transistor to fully turn off the third P-type transistor.

5. The circuit of claim 1, wherein the output buffer comprises a plurality of N-type transistors connected in series, and the pre-driver refers to the tracking signal to generate the control signal to control a gate electrode of one of the plurality of N-type transistors.

6. The circuit of claim 5, wherein when the circuit operates in the input mode, the circuit receives the input signal from the pad, the output buffer is disabled, and the pre-driver refers to the tracking signal to generate the control signal to control the one of the plurality of N-type transistors.

7. The circuit of claim 6, wherein the plurality of N-type transistors comprises:
a first N-type transistor, wherein a drain electrode of the first N-type transistor is coupled to the pad;
a second N-type transistor, wherein a drain electrode of the second N-type transistor is coupled to a source electrode of the first N-type transistor; and
a third N-type transistor, wherein a drain electrode of the third N-type transistor is coupled to a source electrode of the second N-type transistor, and a source electrode of the third N-type transistor is coupled to the ground voltage;
wherein the pre-driver refers to the tracking signal to generate the control signal to control the first N-type transistor.

8. The circuit of claim 7, wherein a gate electrode of the second N-type transistor is biased by a first bias voltage lower than the supply voltage, a gate electrode of the third N-type transistor is biased by a second bias voltage lower than the first bias voltage; and if a voltage level of the input signal is greater than the supply voltage of the output buffer, the pre-driver generates the control signal whose voltage level is equal to the supply voltage to control the gate electrode of the first N-type transistor; if the voltage level of the input signal is between the supply voltage the first bias voltage, the pre-driver generates the control signal whose voltage level is proportional to the voltage level of the input signal to control the gate electrode of the first N-type transistor; and if the voltage level of the input signal is lower than the first bias voltage, the pre-driver generates the control signal whose voltage level is equal to the first bias voltage to control the gate electrode of the first N-type transistor.

9. The circuit of claim 7, further comprising:
an input buffer, coupled to the source electrode of the first N-type transistor;
wherein when the circuit operates in the input mode, the input buffer receives the input signal via the pad and the first N-type transistor.

10. The circuit of claim 1, wherein the at least one P-type transistor and at least one N-type transistor are high voltage devices.

11. A circuit, comprising:
an output buffer comprising at least one P-type transistor and at least one N-type transistor, wherein the at least one P-type transistor is coupled between a supply voltage and a pad, and the at least one N-type transistor is coupled between a ground voltage and the pad;
a tracking circuit, coupled to the pad, for generating a tracking signal according to a voltage level at the pad; and
a pre-driver, coupled to the tracking circuit, for generating a control signal to control the at least one P-type transistor or the at least one N-type transistor according to the tracking signal;
wherein the output buffer comprises a plurality of P-type transistors connected in series, and the pre-driver refers to the tracking signal to generate the control signal to control a gate electrode of one of the plurality of P-type transistors;
wherein if a voltage level of the input signal is greater than the supply voltage of the output buffer, the control signal applied to the one of the plurality of P-type transistors is proportional to the input signal.

12. A circuit, comprising:
an output buffer comprising at least one P-type transistor and at least one N-type transistor, wherein the at least one P-type transistor is coupled between a supply voltage and a pad, and the at least one N-type transistor is coupled between a ground voltage and the pad;
a tracking circuit, coupled to the pad, for generating a tracking signal according to a voltage level at the pad; and
a pre-driver, coupled to the tracking circuit, for generating a control signal to control the at least one P-type transistor or the at least one N-type transistor according to the tracking signal;
wherein the output buffer comprises a plurality of N-type transistors connected in series, and the pre-driver refers to the tracking signal to generate the control signal to control a gate electrode of one of the plurality of N-type transistors;

wherein the plurality of N-type transistors comprises:
- a first N-type transistor, wherein a drain electrode of the first N-type transistor is coupled to the pad;
- a second N-type transistor, wherein a drain electrode of the second N-type transistor is coupled to a source electrode of the first N-type transistor; and
- a third N-type transistor, wherein a drain electrode of the third N-type transistor is coupled to a source electrode of the second N-type transistor, and a source electrode of the third N-type transistor is coupled to the ground voltage;

wherein the pre-driver refers to the tracking signal to generate the control signal to control the first N-type transistor.

13. The circuit of claim 12, wherein the circuit selectively operates in an input mode or an output mode, when the circuit operates in the input mode, the circuit receives an input signal from the pad, the output buffer is disabled, and the pre-driver refers to the tracking signal to generate the control signal to control the one of the plurality of N-type transistors.

\* \* \* \* \*